(12) United States Patent
Kruschwitz et al.

(10) Patent No.: US 7,065,115 B2
(45) Date of Patent: Jun. 20, 2006

(54) EXTERNAL CAVITY ORGANIC LASER

(75) Inventors: Brian E. Kruschwitz, Rochester, NY (US); Francisco J. Duarte, Rochester, NY (US); Andrew F. Kurtz, Rochester, NY (US); John P. Spoonhower, Webster, NY (US)

(73) Assignee: Eastman Kodak Company, Rochester, NY (US)

( * ) Notice: Subject to any disclaimer, the term of this patent is extended or adjusted under 35 U.S.C. 154(b) by 7 days.

(21) Appl. No.: 10/767,713

(22) Filed: Jan. 29, 2004

(65) Prior Publication Data
US 2004/0264528 A1 Dec. 30, 2004

Related U.S. Application Data

(63) Continuation of application No. 10/272,611, filed on Oct. 16, 2002, now abandoned.

(51) Int. Cl.
*H01S 3/14* (2006.01)
*H01S 3/20* (2006.01)
*H01S 3/08* (2006.01)

(52) U.S. Cl. ............... 372/39; 372/53; 372/92; 372/99

(58) Field of Classification Search ............... 372/53, 372/39
See application file for complete search history.

(56) References Cited

U.S. PATENT DOCUMENTS

| | | | |
|---|---|---|---|
| 4,469,407 A * | 9/1984 | Cowan et al. ............... 359/888 |
| 4,731,788 A * | 3/1988 | Shoshan ..................... 372/9 |
| 5,131,002 A | 7/1992 | Mooradian | |
| 5,553,088 A | 9/1996 | Brauch et al. | |
| 5,761,234 A * | 6/1998 | Craig et al. ............... 372/75 |
| 5,881,083 A | 3/1999 | Diaz-Garcia et al. | |
| 5,881,089 A | 3/1999 | Berggren et al. | |
| 5,991,318 A | 11/1999 | Caprara et al. | |
| 6,097,742 A | 8/2000 | Caprara et al. | |
| 6,160,828 A * | 12/2000 | Kozlov et al. ............... 372/39 |
| 6,243,407 B1 | 6/2001 | Mooradian | |
| 6,259,711 B1 * | 7/2001 | Laurell ...................... 372/22 |
| 6,370,168 B1 | 4/2002 | Spinelli ..................... 372/22 |
| 6,611,546 B1 * | 8/2003 | Garnache et al. ........... 372/92 |
| 6,876,684 B1 * | 4/2005 | Kahen et al. ............... 372/39 |
| 2002/0054614 A1 | 5/2002 | Jin ........................... 372/20 |

FOREIGN PATENT DOCUMENTS

WO  WO 98/50989  11/1998
WO  WO 99/12235  3/1999

OTHER PUBLICATIONS

M. Berggren et al., "Light Amplification in Organic Thin Films Using Cascade Energy Transfer," Letters To Nature, vol. 389, Oct. 2, 1997, pp. 466-469.

(Continued)

*Primary Examiner*—Armando Rodriguez
(74) *Attorney, Agent, or Firm*—Stephen H. Shaw

(57) ABSTRACT

A thin-film organic laser, that includes: a substrate; a bottom mirror provided on the substrate; at least one active region deposited on the bottom mirror, wherein the at least one active region includes organic gain material; an external mirror provided at a predetermined distance from the at least one active region such that the bottom mirror combined with the external mirror forms a laser resonator; and an optical pumping means for exciting the organic gain material to produce a laser beam with a wavelength $\lambda$ and at least one lateral laser mode in the laser resonator and an output of laser light.

23 Claims, 8 Drawing Sheets

OTHER PUBLICATIONS

N. Tessler et al., "Pulsed Excitation of Low-Mobility Light-Emitting Diodes: Implication For Organic Lasers," Applied Physics Letters, vol. 74, No. 19, May 10, 1999, pp. 2764-2766.

V. G. Kozlov et al., "Study of Lasing Action Based on Forster Energy Transfer in Optically Pumped Organic Semiconductor Thin Films," Journal of Applied Physics, vol. 84, No. 8, Oct. 15, 1998, pp. 4096-4108.

Nir Tessler et al., "High Peak Brightness Polymer Light-Emitting Diodes," Advanced Materials, vol. 10, No. 1, 1998, pp. 64-68.

M. D. McGehee et al., "Semiconducting Polymer Distributed Feedback Lasers," Applied Physics Letters, vol. 72, No. 13, Mar. 30, 1998, pp. 1536-1538.

Scott W. Corzine et al., Design of Fabry-Perot Surface-Emitting Lasers With a Periodic Gain Structure, IEEE Journal of Quantum Electronics, vol. 25, No. 6, Jun. 1989, pp. 1513-1524.

Anthony E. Siegman, "LASERS," University Science Books, Mill Valley, California, 1986, pp. 691-758.

G. Kranzelbinder et al., "Organic Solid-State Lasers," Rep. Prog. Phys. 63, 2000, pp. 729-762.

T. Ishigure et al., "2.5 Gbit/s 100m Data Transmission Using Graded-Index Polymer Optical Fibre and High-Speed Laser Diode at 650nm Wavelength," Electronics Letters, vol. 31, No. 6, Mar. 16, 1995, pp. 467-469.

* cited by examiner

EXTERNAL CAVITY ORGANIC LASER

CROSS-REFERENCE TO RELATED APPLICATIONS

This is a continuation of application Ser. No. 10/272,611 filed on 16 Oct. 2002 now abandoned, incorporated herein by reference.

FIELD OF THE INVENTION

The invention relates generally to the field of lasers, and in particular to visible lasers using organic gain media. More specifically, the invention relates to a visible laser in which a thin film of organic gain material is provided within a resonator in order to control the characteristics of one or more lasing modes.

BACKGROUND OF THE INVENTION

There are many potential applications for visible lasers, such as display, optical storage reading/writing, laser printing, and short-haul telecommunications employing plastic optical fibers (T. Ishigure et al., Electronics Letters, Mar. 16, 1995, Vol. 31, No. 6). For these applications, laser sources that are cost effective, moderately powerful, and that span the visible spectrum are desired. For infrared applications, the requirements for cost effectiveness and power have been well met by semiconductor laser diodes. However, in spite of the worldwide efforts of many industrial and academic laboratories, much work remains to be done to create viable laser diodes that produce light output that spans the visible spectrum, with the problem being especially acute in the green spectral region. Visible solid-state lasers using standard laser crystals (such as Nd:YAG) and frequency-doubling have been developed, but have not achieved the low-cost criteria. These lasers are also unable to provide the selection of arbitrary visible wavelengths that are desired. The same problems exist for gas lasers, along with the additional problem of extremely low wallplug efficiency.

In an effort to produce visible wavelength lasers, it would be advantageous to abandon inorganic-based systems and focus on organic-based laser systems, since organic-based gain materials can enjoy a number of advantages over inorganic-based gain materials in the visible spectrum. Traditional dye lasers, for example offer a very wide range of wavelengths. However, liquid dye lasers have not proven to be feasible in non-laboratory applications.

Other organic-based gain materials have the beneficial properties of low unpumped scattering/absorption losses and high quantum efficiencies. In comparison to inorganic laser systems, organic lasers are relatively inexpensive to manufacture, can be made to emit over the entire visible range, can be scaled to arbitrary size and, most importantly, are able to emit multiple wavelengths (such as red, green, and blue) from a single chip. Over the past number of years, there has been increasing interest in making organic-based solid-state lasers. The laser gain material has been either polymeric or small molecule and a number of different resonant cavity structures were employed, such as, microcavity (Kozlov et al., U.S. Pat. No. 6,160,828 issued Dec. 12, 2000, titled "Organic Vertical-Cavity Surface-Emitting Laser"), waveguide, ring microlasers, and distributed feedback (see also, for instance, G. Kranzelbinder et al., Rep. Prog. Phys. 63, 729 (2000) and Diaz-Garcia et al., U.S. Pat. No. 5,881, 083 issued Mar. 09, 1999, titled "Conjugated Polymers As Materials For Solid State Laser"). Kozlov also disclosed an external cavity laser in U.S. Pat. No. 6,160,828. Koslov teaches an electrically pumped laser device in a cavity between two planar surfaces that includes an intracavity lens.

A problem with all of these structures is that in order to achieve lasing it was necessary to excite the cavities by optical pumping using another laser source. It is much preferred to electrically pump the laser cavities since this generally results in more compact and easier to modulate structures.

The external cavity embodiment disclosed by Kozlov in U.S. Pat. No. 6,160,828 is electrically pumped, however, the disclosed external cavity requires a transparent electrode deposited above the organic gain materials in order to operate as intended. Currently, the only viable electrically conductive transparent material in use is indium tin oxide (ITO), for which the deposition process commonly requires the substrate to be heated at an elevated temperature that would destroy most commonly used organic luminescent materials. Therefore, Kozlov's disclosed embodiment may prove difficult to manufacture.

A main barrier to achieving electrically-pumped organic lasers is the small carrier mobility of organic material, which is typically on the order of $10^{-5}$ cm$^2$/(V-s). This low carrier mobility results in a number of problems. Devices with low carrier mobilities are typically restricted to using thin layers in order to avoid large voltage drops and ohmic heating. These thin layers result in the lasing mode penetrating into the lossy cathode and anode, which causes a large increase in the lasing threshold (Kozlov et al., Journal of Applied Physics, Vol. 84, No. 8, Oct. 15, 1998). Since electron-hole recombination in organic materials is governed by Langevin recombination (whose rate scales as the carrier mobility), low carrier mobilities result in orders of magnitude having more charge carriers than singlet excitons; one of the consequences of this is that charge-induced (polaron) absorption can become a significant loss mechanism (Tessler et al., Applied Physics Letters, Vol. 74, No. 19, May 10, 1999). Assuming laser devices have a 5% internal quantum efficiency, using the lowest reported lasing threshold to date of ~100 W/cm$^2$ (Berggren et al., Letters to Nature Vol. 389, Oct. 02, 1997), and ignoring the above mentioned loss mechanisms would put a lower limit on the electrically-pumped lasing threshold of 1000 A/cm$^2$. Including these loss mechanisms would place the lasing threshold well above 1000 A/cm$^2$, which to date is the highest reported current density, which can be supported by organic devices (Tessler et al., Advanced Materials, 1998, Vol. 10, No. 1).

One of the advantages of organic-based lasers is that since the gain material is typically an amorphous film, devices can be formed inexpensively when compared to lasers with gain materials that require a high degree of crystallinity (either inorganic or organic materials). Additionally, lasers based upon organic amorphous gain materials can be fabricated over large areas without regard to producing large regions of single crystalline material; as a result they can be scaled to arbitrary size resulting in greater output powers. Because of their amorphous nature, organic-based lasers can be grown on a wide variety of substrates; thus, materials such as glass, flexible plastics, and Si are possible supports for these devices. Thus there can be significant cost advantages as well as a greater choice in usable support materials for amorphous organic-based lasers. The usage of single crystal organic lasers would obviate all of these advantages.

An alternative to electrical pumping for organic lasers is optical pumping by incoherent light sources, such as, light emitting diodes (LEDs), either inorganic (McGehee et al., Applied Physics Letters, Vol. 72, No. 13, Mar. 30, 1998) or organic (Berggren et al., U.S. Pat. No. 5,881,089 issued Mar. 9, 1999, titled "Article Comprising An Organic Laser"). This possibility is the result of unpumped organic laser systems having greatly reduced combined scattering and absorption losses (~0.5 cm$^{-1}$) at the lasing wavelength, especially when one employs a host-dopant combination as the active media. Even taking advantage of these small losses, the lowest reported optically-pumped threshold density for organic lasers to date is 100 W/cm$^2$ based on a waveguide laser design (Berggren et al., Letters to Nature, Vol. 389, Oct. 02, 1997). Since off-the-shelf inorganic LEDs can only provide up to ~20 W/cm$^2$ of power density, it is necessary to take a different route to enable optical pumping by incoherent sources. There are a few disadvantages to organic-based gain media, but with careful laser system design these can be overcome. Organic materials are sensitive to a variety of environmental factors like oxygen and water vapor. Efforts to reduce sensitivity to these variables typically result in increased device lifetime. Additionally, organic materials can suffer from low optical and thermal damage thresholds. Devices will have a limited pump power density in order to preclude irreversible damage to the device.

For this reason, generating high power from an organic laser poses a difficult problem. In order to generate a high power and remain within prescribed limits for the power density, it is necessary to use a very large area for the generation of the laser power. However, one must also maintain a coherent beam, which is difficult in a thin film structure.

When faced with a similar problem with inorganic semiconductors and solid-state lasers, it has been known to utilize a thin gain medium in an external resonator. For example, in U.S. Pat. No. 5,553,088 by Brauch et al., issued Sep. 03, 1996, titled "Laser Amplifying System," a thin disk of optically-pumped solid laser material is situated on one end mirror of a standard laser resonator. The resonator can be designed to produce a single Gaussian laser mode with a relatively large area on the laser material in order to scale the laser power without damaging the laser material. A similar technique has also been known using vertically-emitting semiconductor laser structures. One version using multiple passes over the laser structure was disclosed in U.S. Pat. No. 5,131,002 by Mooradian, issued Jul. 14, 1992, titled "External Cavity Semiconductor Laser System." More recently, more standard laser resonators have been disclosed with vertically-emitting semiconductor laser structures, both optically-pumped (U.S. Pat. No. 5,991,318 issued to Caprara et al. on Nov. 23, 1999, titled "Intracavity Frequency-Converted Optically-Pumped Semiconductor Laser," and related patents) and electrically-pumped (U.S. Pat. No. 6,243,407 issued to Mooradian on Jun. 05, 2001, titled "High Power Laser Devices").

A disadvantage that all these lasers share is the need to use nonlinear frequency conversion to generate visible laser light. This adds to the cost of the laser system due to the need for a nonlinear optical material and the appropriate phase-matching provisions. Furthermore, the resulting requirement for a stable single longitudinal mode is a disadvantage for display applications (in which a broad spectral width is desired for speckle suppression) and other applications that require wavelength tunability. Finally, the frequency conversion, especially in continuous-wave operation, reduces the efficiency of the laser, requiring more optical pump power (for the optically-pumped cases) and a larger mode area.

Another disadvantage faced by the optically-pumped external cavity lasers disclosed in '088, '002, and '318, is that the laser materials are characterized by threshold densities high enough to require another laser as the pump source. It would be desired to use less costly, incoherent sources such as light-emitting-diodes for optical pumping should the threshold densities become low enough for practical usage of light emitting diodes. A third disadvantage of the above materials is that they are all crystalline and grown on flat substrates.

There is a need for a good quality laser beam with high-power operation, laser mode control, and tunability in an organic-based laser structure capable of excitation with incoherent light sources such as LEDs.

SUMMARY OF THE INVENTION

The aforementioned need is met by the present invention by providing a thin-film organic laser, that includes: a substrate; a bottom mirror provided on the substrate; at least one active region deposited on the bottom mirror, wherein the at least one active region includes organic gain material; an external mirror provided at a predetermined distance from the at least one active region such that the bottom mirror combined with the external mirror forms a laser resonator; and an optical pumping means for exciting the organic gain material to produce a laser beam with a wavelength $\lambda$ and at least one lateral laser mode in the laser resonator and an output of laser light.

ADVANTAGES

The present invention has the advantage of scaling of optical power by utilizing a large area of gain material. Additionally, the present invention uses a low loss resonator that is suitable to be optically pumped by inexpensive sources. None of the disadvantages of the systems discussed above are inherent with the present invention.

BRIEF DESCRIPTION OF THE DRAWINGS

The above and other objects, features, and advantages of the present invention will become more apparent when taken in conjunction with the following description and drawings wherein identical reference numerals have been used, where possible, to designate identical features that are common to the figures, and wherein.

To facilitate understanding, identical reference numerals have been used, where possible, to designate identical elements that are common to the figures.

DETAILED DESCRIPTION OF THE INVENTION

The present invention uses organic-based gain materials in an external cavity laser structure. This obviates the need for nonlinear optics to generate visible wavelengths, allows incoherent optical pumping, and utilizes a curved substrate as a support for the organic laser material. As an added advantage, the very broad gain bandwidth of organic laser materials is utilized in a tunable laser cavity to realize extremely large tuning ranges. Consequently, the present invention includes a laser resonator with a minimum of intracavity optics; thin active material on the curved surface of a concave mirror; and a mode area which is very large.

Moreover, the present invention addresses several problems. First, in order to pump with LEDs, the cavity losses should, preferably, be kept to a minimum to keep the threshold pump density low, and the available pump light must be used efficiently. Additionally, in order to lower the lasing threshold, it is necessary to choose a laser structure that minimizes the cavity losses. With a low loss cavity, practical organic laser devices can be driven by optically pumping them with a variety of readily available, incoherent light sources, such as LEDs.

Secondly, the low maximum pump density requirement forces a very large mode area to be used in order to scale up to a level of 20 mW or greater. Thirdly, provisions for achieving control of both the lateral modes and longitudinal modes must be provided. Finally, because of the low thermal damage threshold of organic laser materials, care must be taken to remove heat from the organic laser structure that is generated during the pumping process.

Figure 1:
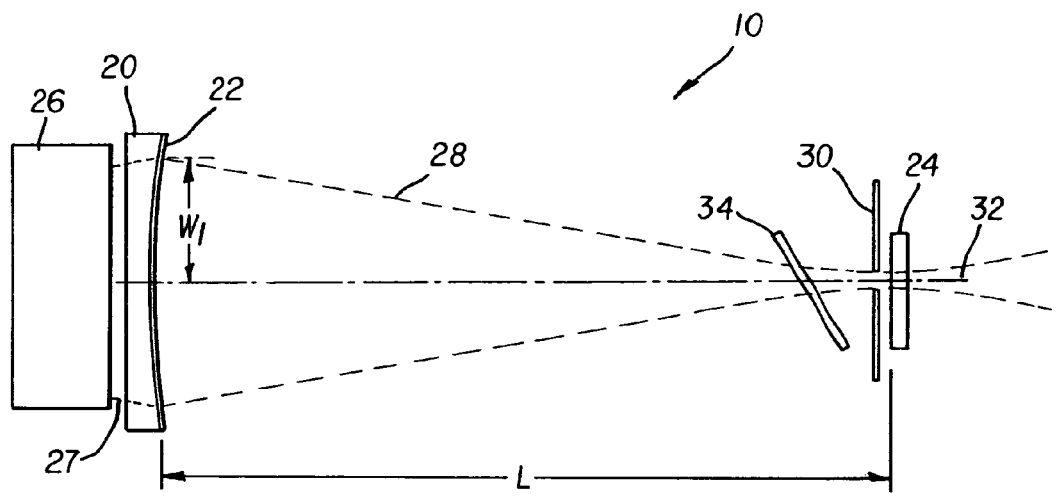
FIG. 1 is a schematic view of a thin-film organic laser in accordance with the present invention.

Referring to FIG. 1, a schematic of the thin-film organic laser 10 is shown. The thin-film organic laser 10 comprises a substrate 20 with an organic laser film structure 22 deposited on a surface. An optical pumping means 26 is provided on the opposite side of the substrate 20 from the organic laser film structure 22. The optical pumping means 26 emits pump light 27 with a wavelength and intensity as required to energize the organic laser film structure 22 to emit a laser beam 28 with a laser wavelength, λ. The laser wavelength λ is within a range of desired laser wavelengths that may represent a tuning range. An external mirror 24 provides optical feedback to cause stimulated emission, and therefore all the required elements of a laser are provided. An emitted laser beam 32 is produced, which comprises the portion of the laser beam 28 that passes through the external mirror 24.

Whereas Kozlov discloses an electrically pumped laser having an external cavity, the present invention uses an optically pumped configuration in a different type of resonator than that disclosed in Kozlov. For instance, the two cavities described in Kozlov are essentially different than the present invention, because the cavity in the present invention includes one curved surface, which acts a mirror. Specifically, the present invention discloses a laser cavity between a curved (concave) surface and a plane surface. In contrast, Kozlov discloses two curved intracavity surfaces. In addition to this straight forward observation, it can be shown, using propagation matrices (as described in the book LASERS, by A. E. Siegman) that the overall beam propagation matrices for the present invention's cavities versus Kozlov's disclosed cavities are distinctly different.

Figure 2:
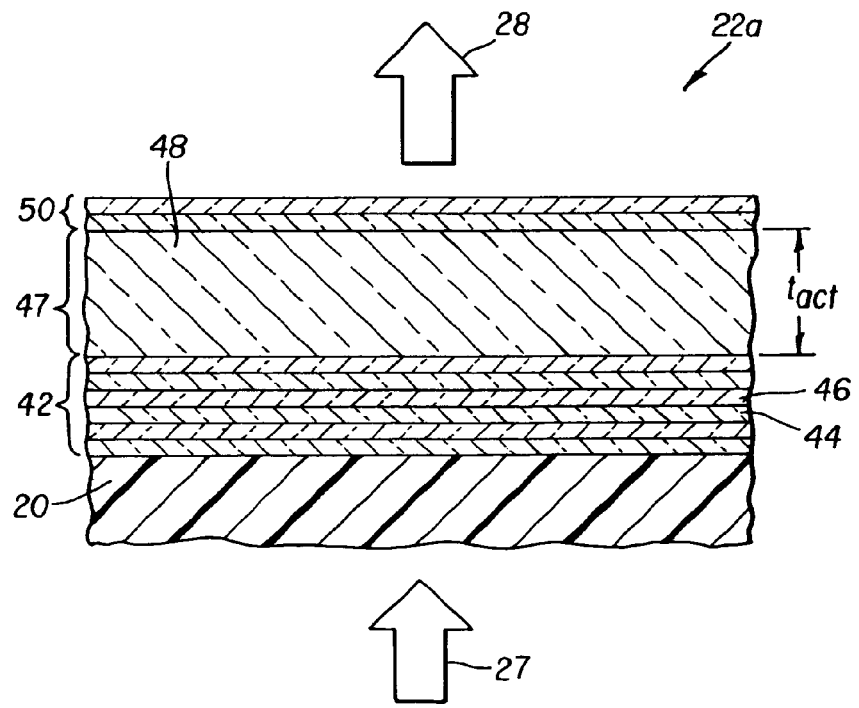
FIG. 2 is a cross-section of a first organic laser film structure.

Turning now to FIG. 2, one embodiment of the organic laser film structure 22 of FIG. 1 is described in detail. Alternative embodiments will be described in the discussion of FIGS. 4 through 8. FIG. 2 shows a cross-section of a first organic laser film structure 22a. The first organic laser film structure 22a is provided atop the substrate 20 and comprises a bottom mirror 42. The bottom mirror 42 is preferably highly reflective over the desired range of wavelengths to be produced by the thin-film organic laser 10, and is transmissive over the range of useful wavelengths and incidence angles of the pump light 27. An active region 47 with a thickness $t_{act}$ is provided atop the bottom mirror 42, the active region 47 comprising an organic gain layer 48. When pumped to its excited state, the organic gain layer 48 provides optical gain, meaning incident light with wavelength within an optical gain bandwidth will become amplified through stimulated emission. The thickness $t_{act}$ is preferably between 0.1 µm and 20 µm. A thicker layer is preferable for reduced threshold density, at the expense of fabrication time, difficulty, and susceptibility to spatial hole burning. A top pump mirror 50 is provided atop the organic gain layer 48, which is highly reflective at the wavelength of the pump light 27. The purpose of the top pump mirror 50 is to allow the pump light 27 to make two passes through the organic gain layer 48 in order to increase the proportion of pump light 27 that is absorbed. The top pump mirror 50 is also transmissive over the desired range of laser wavelengths, preferably with a reflectivity less than 1%.

The preferred molecular compositions of the material in the organic gain layer 48 are small-molecular weight organic host-dopant combinations typically deposited by high-vacuum thermal evaporation. These host-dopant combinations are advantageous since they result in very small unpumped scattering/absorption losses for the gain media. It is preferred that the organic molecules be of small-molecular weight since vacuum-deposited materials can be deposited more uniformly than spin-coated polymeric materials. It is also preferred that the host materials used in the present invention are selected such that they have sufficient absorption of the pump light 27 and are able to transfer a large percentage of their excitation energy to a dopant material via Forster energy transfer. The dopant material, once in its excited state, can return to its ground state via a radiative process, which produces the laser beam 28.

Those skilled in the art are familiar with the concept of Förster energy transfer, which involves a radiationless transfer of energy between the host and dopant molecules. An example of a useful host-dopant combination for red-emitting lasers is aluminum tris(8-hydroxyquinoline) (Alq) as the host and [4-(dicyanomethylene)-2-t-butyl-6-(1,1,7,7-tetramethyljulolidyl-9-enyl)-4H-pyran] (DCJTB) as the dopant (at a volume fraction of 1%). Other host-dopant combinations can be used for other wavelength emissions. For example, in the green a useful combination is Alq as the host and [10-(2-benzothiazolyl)-2,3,6,7-tetrahydro-1,1,7,7-tetramethyl-1H,5H,11H-[1]Benzopyrano[6,7,8-ij]quinolizin-11-one] (C545T) as the dopant (at a volume fraction of 0.5%). Other organic gain region materials can be polymeric substances, e.g., polyphenylenevinylene derivatives, dialkoxy-polyphenylenevinylenes, poly-para-phenylene derivatives, and polyfluorene derivatives, as taught by Wolk et al. in commonly assigned U.S. Pat. No. 6,194,119 B1 issued Feb. 27, 2001, titled "Thermal Transfer Element And Process For Forming Organic Electroluminescent Devices," and referenced herein. The active region 47 comprising the organic gain layer 48 receives transmitted pump light 27 and for emits laser beam 28.

The bottom mirror 42 and the top pump mirror 50 are preferably dielectric coatings comprising alternating high-index layers 44 and low-index layers 46. The high-index layers 44 and low-index layers 46 are preferably deposited by conventional electron-beam deposition and can be, for example, nominally quarter-wave thicknesses of $TiO_2$ and $SiO_2$, respectively. Other materials, such as $Ta_2O_5$ for the high index layers 44, could be used, as well as other deposition processes, such as sputtering or ion-assisted deposition. The bottom mirror 42 is deposited at a temperature of approximately 240° C. During the top pump mirror 50 deposition process, the temperature is maintained at around 70° C. to avoid melting the organic active materials.

Returning now to FIGS. 1 and 2, the bottom mirror 42 and the external mirror 24 define a laser resonator, or external cavity. The substrate 20 and external mirror 24 are aligned relative to an optical axis and are spaced apart by a distance defining a cavity length L. Cavity length L is actually an optical thickness, i.e. the sum of the products of the refractive indices and thicknesses of each material within the resonator. In all practical cases, though, this will be dominated by the distance in air between the substrate 20 and the external mirror 24, and hence closely resembles the physical length of the resonator. The lowest shortest resonator length L would be equal to the active region thickness $t_{act}$. Below this, an external resonator is meaningless. Practically, in order to generate a reasonable mode size for moderate power, the resonator length L would be greater than 10 mm.

The resonator is also characterized by a cavity loss, which is the total sum of all mechanisms by which laser light is removed from the cavity. The cavity loss comprises mirror loss and internal losses. The mirror losses describe the proportion of the power in the laser beam 28 (shown in FIG. 2) that is transmitted through the bottom mirror 42 (shown in FIG. 2), and the external mirror 24 (shown in FIG. 2), in one round-trip through the resonator. The internal losses describe the proportion of the power in the laser beam 28 that is lost in one round-trip through the resonator due to absorption within the organic laser film structure 22 and other materials within the resonator, as well as reflection and scattering losses from surfaces of intracavity elements.

The optical pumping means 26 emits pump light 27 with at least one wavelength that is useful for energizing the organic laser film structure 22, preferably between 380 nm and 440 nm, depending on the host material. Particular embodiments of the optical pumping means 26 will be discussed in describing FIGS. 9 through 11. The pump light 27 has angular and spatial intensity profiles characterizing the illumination of the organic laser film structure 22. The pump light 27 must provide a power density greater than the threshold power density. The threshold power density is defined as the power density required to produce a round-trip gain for the laser beam 28 that equals the cavity loss.

In order to use LEDs as the source in the optical pumping means 26, the threshold power density must be kept below the inherent brightness limit of the LED output. In order to achieve this, it is desired that the bottom mirror 42 have a reflectivity greater than 99% and the external mirror 24 have a reflectivity greater than 95%. Both reflectivities should exceed these minimum requirements over the entire range of possible laser wavelengths.

The substrate 20 is transparent to the pump light 27, and is preferably a heat conductive material. A preferred material is sapphire, although fused silica, other optical glasses, or transparent plastics could be used, particularly for low-power applications. The substrate 20 can also be provided with a curved surface upon which the organic laser film structure 22 is provided. A particularly advantageous surface shape for the substrate 20 is a concave spherical surface.

The resonator is characterized by a number of laser modes, both axial modes that relate primarily to the emitted wavelengths and lateral modes that describe the quality of the laser beam. These are well-known to those skilled in the art. The geometry of a stable resonator defines, in particular, a fundamental $TE_{00}$ lateral mode that has a Gaussian cross-section. At the organic laser film structure 22, the $TE_{00}$ mode is characterized by a mode radius $w_1$, which is defined as the distance from the center of the beam at which the intensity drops off to a factor of $1/e^2$ (or 0.135) of the peak intensity at the center of the beam.

For stable two-mirror spherical resonator configurations, the mode radius $w_1$ of the $TE_{00}$ mode is given by a well-known relation (see, for example, A. E. Siegman, *Laser*, University Science Books, Mill Valley, Calif., 1986), $$w_1^2 = \frac{L\lambda}{\pi} \sqrt{\frac{g_2}{g_1(1-g_1g_2)}} \qquad \text{(Equation 1)}$$

where $\lambda$ is the laser wavelength and $g_1$ and $g_2$ are referred to as the g-parameters for the substrate 20 and the external mirror 24, respectively. These are given by Equation 2.

$$g_{1,2} = 1 - \frac{L}{R_{1,2}} \qquad \text{(Equation 2)}$$

In Equation 2, $R_1$ is the radius of curvature of the substrate 20 and $R_2$ is the radius of curvature of the external mirror 24, assuming both mirrors have spherical or planar surfaces.

It is desired to have $W_1$ large in order to produce a high power. One particular resonator that achieves this is a nearly-hemispheric resonator. In this particular embodiment, the substrate 20 has a concave spherical shape with radius of curvature $R_1$, and the external mirror 24 is planar (i.e. $R_2$ is infinite, and hence $g_2=1$ in Equations 1 and 2). The cavity length L is set to be slightly smaller than the radius of curvature, $R_1$, by a detuning $\Delta$ as denoted mathematically in Equation 3.

$$L = R_1 - \Delta. \text{ } (\Delta > 0 \text{ for stable resonator}) \qquad \text{(Equation 3)}$$

For this special case, the mode radius $W_1$ is given in terms of the radius of curvature $R_1$ and the detuning $\Delta$ in Equation 4.

$$w_1^2 = \frac{\lambda R_1}{\pi} \sqrt{\frac{R_1}{\Delta} - 1} \qquad \text{(Equation 4)}$$

The nearly-hemispheric resonator is also particularly advantageous due to the ease with which the mirrors can be aligned. As discussed in the aforementioned Siegman reference, alignment simply consists of laterally translating the concave mirror (in this case, substrate 20) relative to the optical axis. The desired mode radius $w_1$ is then achieved by translating, via a micrometer, the external mirror 24 relative to the substrate 20 (or vice versa) to produce the detuning $\Delta$ as determined from Equation 4.

Figure 3:
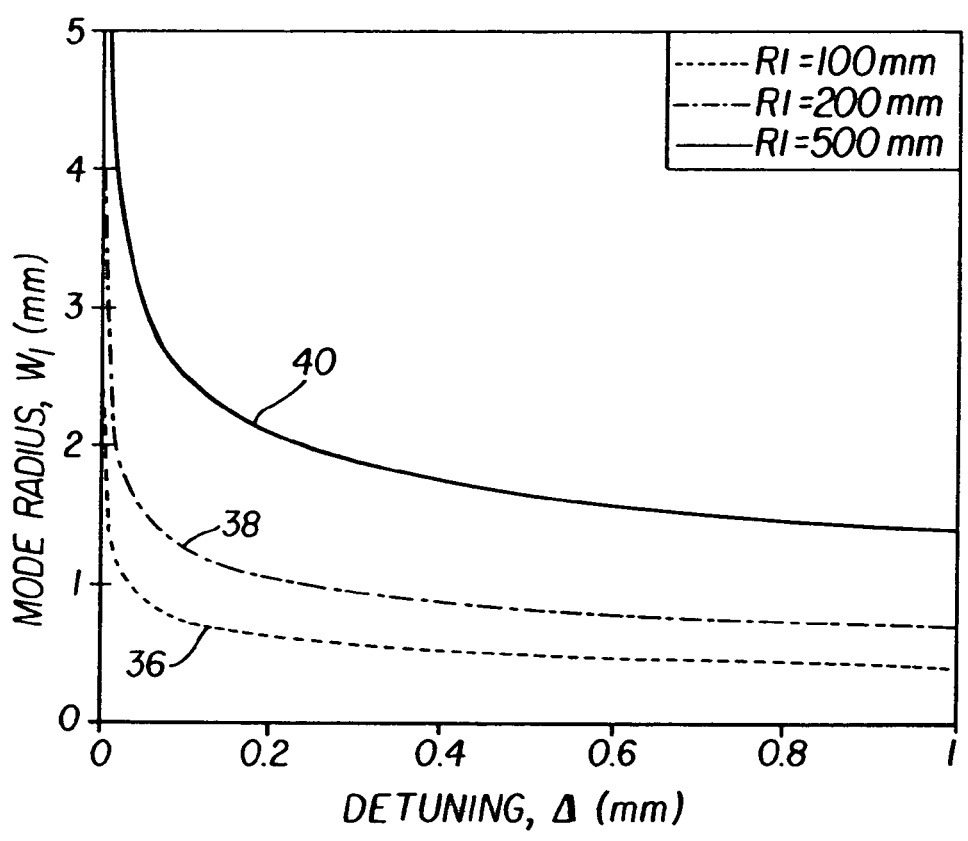
FIG. 3 is a plot showing TE00 mode diameter versus cavity length detuning for a nearly hemispheric resonator using 100-mm, 200-mm, and 500-mm radius-of-curvature mirrors.

The resulting mode radius $w_1$, as a function of the detuning $\Delta$ is plotted in FIG. 3. Curve 36 shows how the mode radius $w_1$ as a function of the detuning $\Delta$ for a nearly-hemispheric resonator with a 100-mm radius of curvature. Curve 38 shows the same for an equivalent resonator with a 200-mm radius of curvature. Curve 40 shows the same for an equivalent resonator with a 500-mm radius of curvature. Using a moderately long cavity, it is apparent that a mode radius of 2 mm or more is readily achievable. Larger mode radii are possible if one is willing to use a longer resonator or operate near the edge of the resonator stability boundary. In FIG. 3, this corresponds to very small $\Delta$, at which $w_1$ diverges.

It is important to note that the reason that the mode can be made large at the active region in this geometry is that the active region is situated on the concave mirror. It has long been known that the power density can be reduced in bulk laser materials by situating them near the concave mirror in a nearly-hemispheric resonator. However, other related external-cavity lasers, such as the optically-pumped vertical cavity semiconductor lasers and thin-disk lasers discussed previously, are fabricated solely on planar substrates. Thus, using such a laser material as the end-mirror of a cavity forces the Gaussian mode to have a beam waist at the active region where the beam diameter is by necessity small for a resonator of reasonable length. The organic laser materials offer the flexibility of being deposited on curved substrates, allowing us to take advantage of the unique properties of the Gaussian mode propagation in a spherical resonator.

Other stable laser resonators are also applicable to the invention. Confocal resonators, which utilize identical spherical mirrors for both the end mirrors with cavity spacing equal to the radii of curvature, offer improved resonator stability at the expense of reduced mode area at the organic laser film structure 22. A nearly concentric resonator could be used instead of a nearly hemispheric resonator, which would offer the benefit of a larger mode area on the external mirror 24 and the capability to collimate the laser beam 28 by adding optical power to the external mirror substrate. These improvements from a nearly concentric resonator would come at the expense of more difficult alignment and reduced mechanical robustness, though. Finally, resonators with more than two mirrors, such as ring resonators or resonators with fold mirrors are known in the art and are within the scope of the invention.

Unstable resonators are also commonly known and are within the scope of the invention. However, because unstable resonators are typically characterized by high cavity losses, they are typically undesirable for the present invention which requires a high-finesse cavity to maintain low threshold pump density.

Returning to FIG. 1, the control of lateral laser modes is now discussed. There are two means by which fundamental $TE_{00}$ operation can be achieved. First, an aperture 30 with a hole is provided that can remove all higher-order modes. If the aperture 30 is circular, all higher-order modes will experience more diffraction loss than the fundamental mode. As is well known to those skilled in the art, the aperture 30 should have a hole with radius chosen to produce a tolerably low loss for the $TE_{00}$ mode and higher losses for $TE_{10}$ and higher-order modes, with the loss difference being sufficient for their suppression. As discussed in the aforementioned Siegman reference, a general rule of thumb is to use an aperture 30 with hole diameter equal to $\pi w_2$, where $w_2$ is the mode radius at the aperture 30. For stable resonators with the aperture located near the external mirror 24, the mode radius $w_2$ is given by Equation 5.

$$w_2^2 = \frac{L\lambda}{\pi} \sqrt{\frac{g_1}{g_2(1 - g_1 g_2)}} \qquad \text{(Equation 5)}$$

In this particular laser system, though, where it is essential that cavity losses for the fundamental mode be kept to a minimum to reduce the threshold, a larger hole would be preferred, with diameter closer to $4w_2$.

The lateral mode control can be further realized by matching the spatial intensity profile of the pump light 27 to the desired spatial intensity profile of the laser beam 28 at the organic laser film structure 22. Because the pumping rate of the laser is proportional to the intensity of the pump light 27, an excitation distribution is defined proportionally to the spatial intensity profile of the pump light 27 at the organic laser film structure 22. For example, if a $TE_{00}$ mode with mode radius $w_1$, is desired, the optical pumping means should produce an excitation distribution that is substantially Gaussian with mode radius $w_1$, and aligned to the desired $TE_{00}$ mode. This effectively acts as a soft Gaussian aperture, and can be used in combination with, or instead of, the aperture 30.

In the thin-film organic laser 10, a wavelength tuning element 34 can be provided. The wavelength tuning element 34 allows the wavelength of the thin-film organic laser 10 to be tuned over a prescribed range. The wavelength tuning element 34 can be, for example, a birefringent tuning element or a wedged Fabry-Perot etalon, both of which are well-known in the art. Alternatively, it is obvious to those skilled in the art that if tuning is not a desired feature of the thin-film organic laser 10, but a linearly polarized output beam is desired, the wavelength tuning element 34, can be replaced by a Brewster window.

Figure 4:
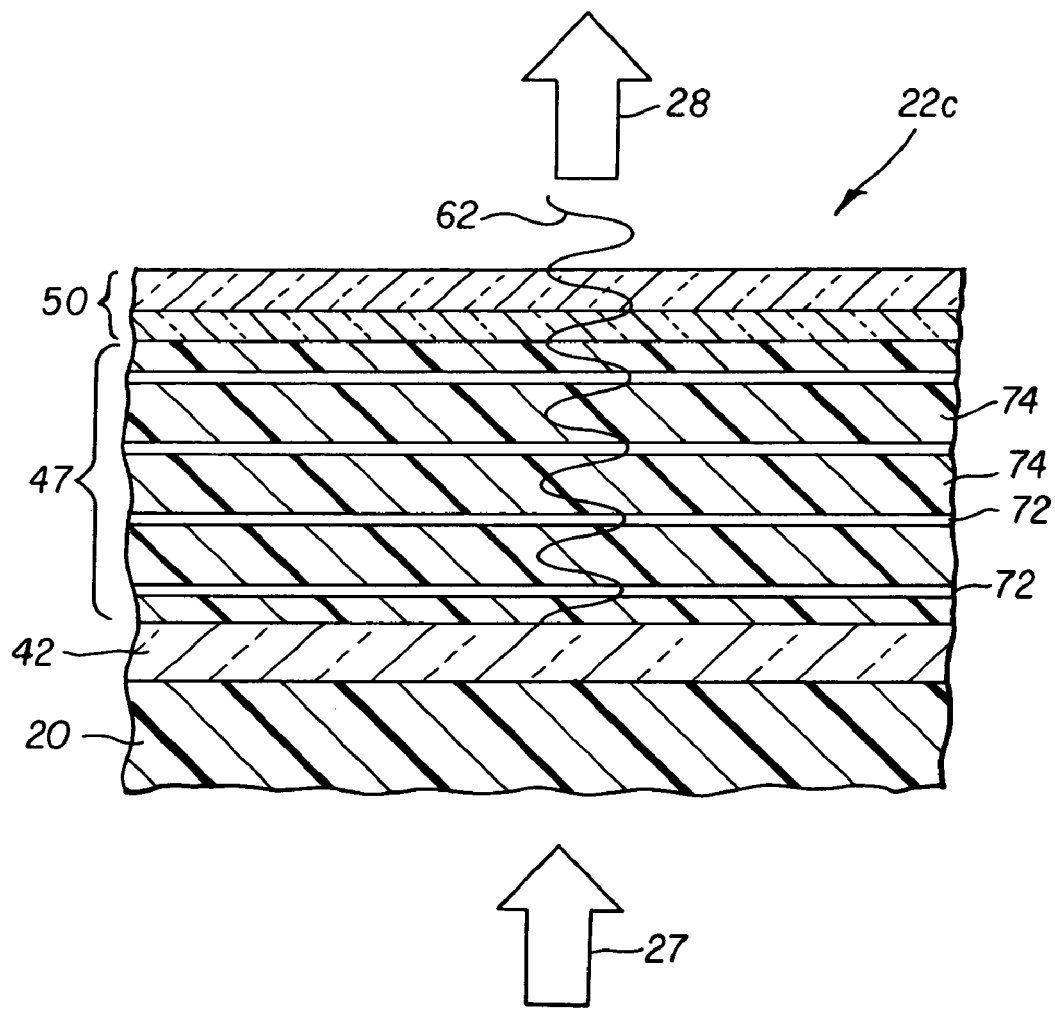
FIG. 4 is a cross-section of a third organic laser film structure that features periodic resonant gain layers.

FIG. 4 shows a cross-section of a third organic laser film structure 22c. The third organic laser film structure 22c is provided atop the substrate 20, and receives pump light 27 in order to produce a laser beam 28. The third organic laser film structure 22c comprises a bottom mirror 42, an active region 47, and a top pump mirror 50. The bottom mirror 42 and the top pump mirror 50 are identical to those in the first organic laser film structure 22a. Specifically, the top pump mirror 50 is transmissive over the possible range of laser wavelengths. Alternatively, an internal mirror could replace the top pump mirror 50 to create a coupled-cavity variant of this embodiment.

The third organic laser film structure 22c differs from the first organic laser film structure 22a in that the active region 47 is characterized by a resonant periodic gain. The active region 47 includes one or more periodic gain regions 72 and organic spacer layers 74 disposed on either side of the periodic gain regions 72 and arranged so that the periodic gain regions 72 are aligned with the peaks of the standing wave 62. This is illustrated in FIG. 4, where the laser's standing wave 62 is schematically drawn. Since stimulated emission is highest at the standing-wave peaks and negligible at the standing-wave nodes, it is inherently advantageous to form the active region 47 as shown in FIG. 4.

The organic spacer layers 74 do not produce stimulated or spontaneous emission and do not significantly absorb either the laser beam 28 or the pump light 27. An example of a material for the spacer layer 74 is the organic material 1,1-Bis-(4-bis(4-methyl-phenyl)-amino-phenyl)-cyclohexane (TAPC). TAPC works well as the spacer material since it largely does not absorb either the laser wavelengths or the pump wavelengths, and, in addition, its refractive index is slightly lower than that of most organic host materials. This refractive index difference is useful since it helps in maximizing the overlap between the standing wave peaks and the periodic gain region(s) 72.

Employing periodic gain region(s) instead of a bulk gain region results in higher power conversion efficiencies and a significant reduction of the unwanted spontaneous emission. The placement of the gain region(s) is determined by using the standard matrix method of optics (Corzine et al. IEEE Journal of Quantum Electronics, Vol. 25, No. 6, June 1989). To get good results, the thicknesses of the periodic gain region(s) 72 need to be at or below 50 nm in order to avoid unwanted spontaneous emission.

Another advantage of employing periodic gain region(s) instead of a bulk gain region, specific to an external resonator concept, is a significant reduction in spatial-hole-burning-induced mode-hopping. This was described phenomenologically by Caprara et al in U.S. Pat. No. 6,097,742, issued Aug. 01, 2000, titled "High-Power External-Cavity Optically-Pumped Semiconductor Lasers."

The aforementioned embodiments of the organic laser film structure 22 utilized a single molecular composition of organic gain material, i.e. a single host-dopant combination. As demonstrated in the following three embodiments of the organic laser film structure 22, multiple molecular compositions of organic gain materials could be used, for example to enable extremely broad tuning ranges by using a wavelength-selective element in the resonator with a very large free spectral range. Alternatively, multiple molecular compositions of organic gain materials could be used to simultaneously generate two or more widely separated wavelengths. One pertinent example is a white laser simultaneously emitting two or more wavelengths in a single beam, wherein the two or more wavelengths mix in color space to produce white. A preferred embodiment for this example would utilize three different wavelengths in the red, green, and blue spectral regions. Alternatively, two wavelengths could be from the cyan and red spectral regions or from the blue and yellow spectral regions.

Figure 5:
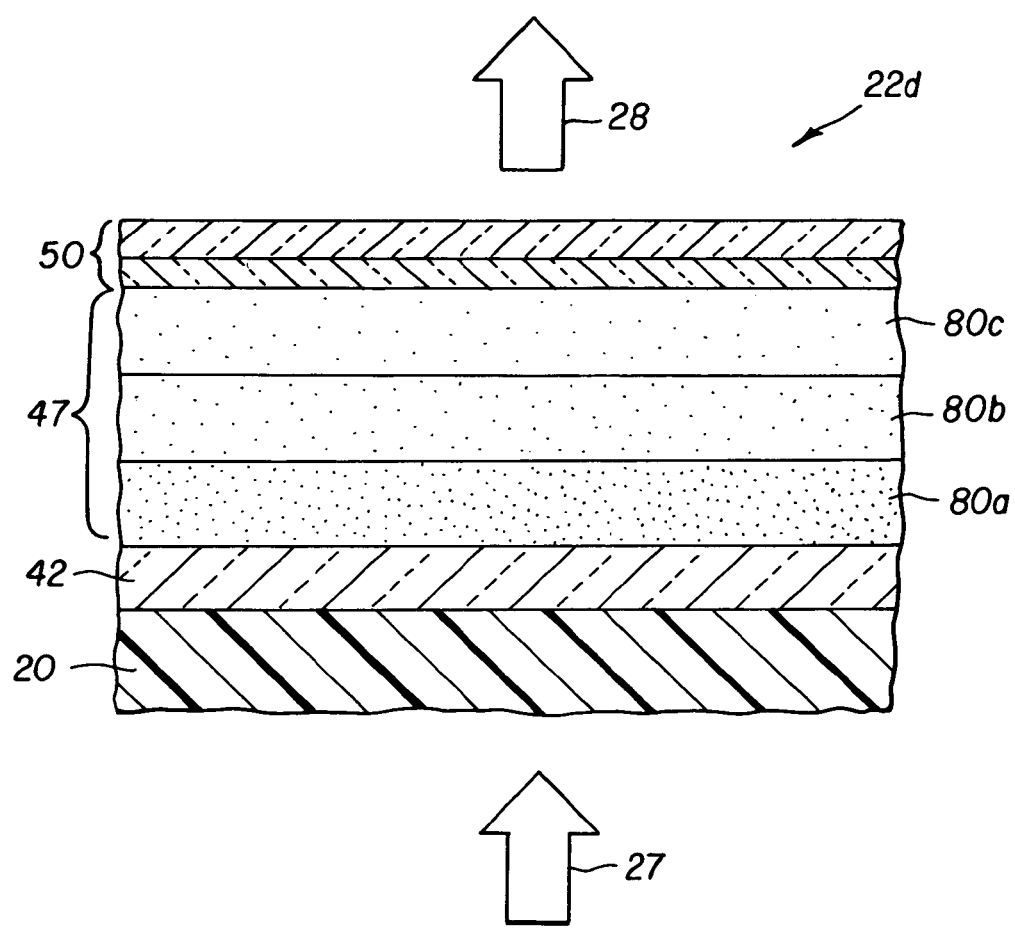
FIG. 5 is a cross-section of a fourth organic laser film structure that features multiple gain regions for multiple wavelength ranges.

FIG. 5 shows a cross-section of a fourth organic laser film structure 22d. The fourth organic laser film structure. 22d is provided atop the substrate 20, and receives pump light 27 in order to produce a laser beam 28. The fourth organic laser film structure 22d comprises a bottom mirror 42, an active region 47, and a top pump mirror 50. The fourth organic laser film structure 22d differs from the first organic laser film structure 22a in that its active region 47 comprises three different bulk organic gain layers containing molecular compositions (organic host-dopant combinations) for three different laser wavelength ranges. The active region 47 comprises a first organic gain layer 80a with a first molecular composition provided atop the bottom mirror 42 that provides gain within a first laser wavelength range. A second organic gain layer 80b with a second molecular composition is provided atop the first organic gain layer 80a and provides gain within a second laser wavelength range. A third organic gain layer 80c with a third molecular composition is provided between the second organic gain layer 80b and the top pump mirror 50 and provides gain within a third laser wavelength range. The bottom mirror 42 in the fourth organic laser film structure 22d must be highly reflective for the wavelengths spanning the first, second, and third laser wavelength ranges while being transmissive to the pump light 27. Conversely, the top pump mirror 50 must be highly transmissive for the wavelengths spanning the first, second, and third laser wavelength ranges while being reflective to the pump light 27. Alternatively, the top pump mirror 50 could be replaced with an internal mirror with a partial reflectance for the wavelengths spanning the first, second, and third laser wavelength ranges in order to create a coupled-cavity variant of this laser.

Figure 6:
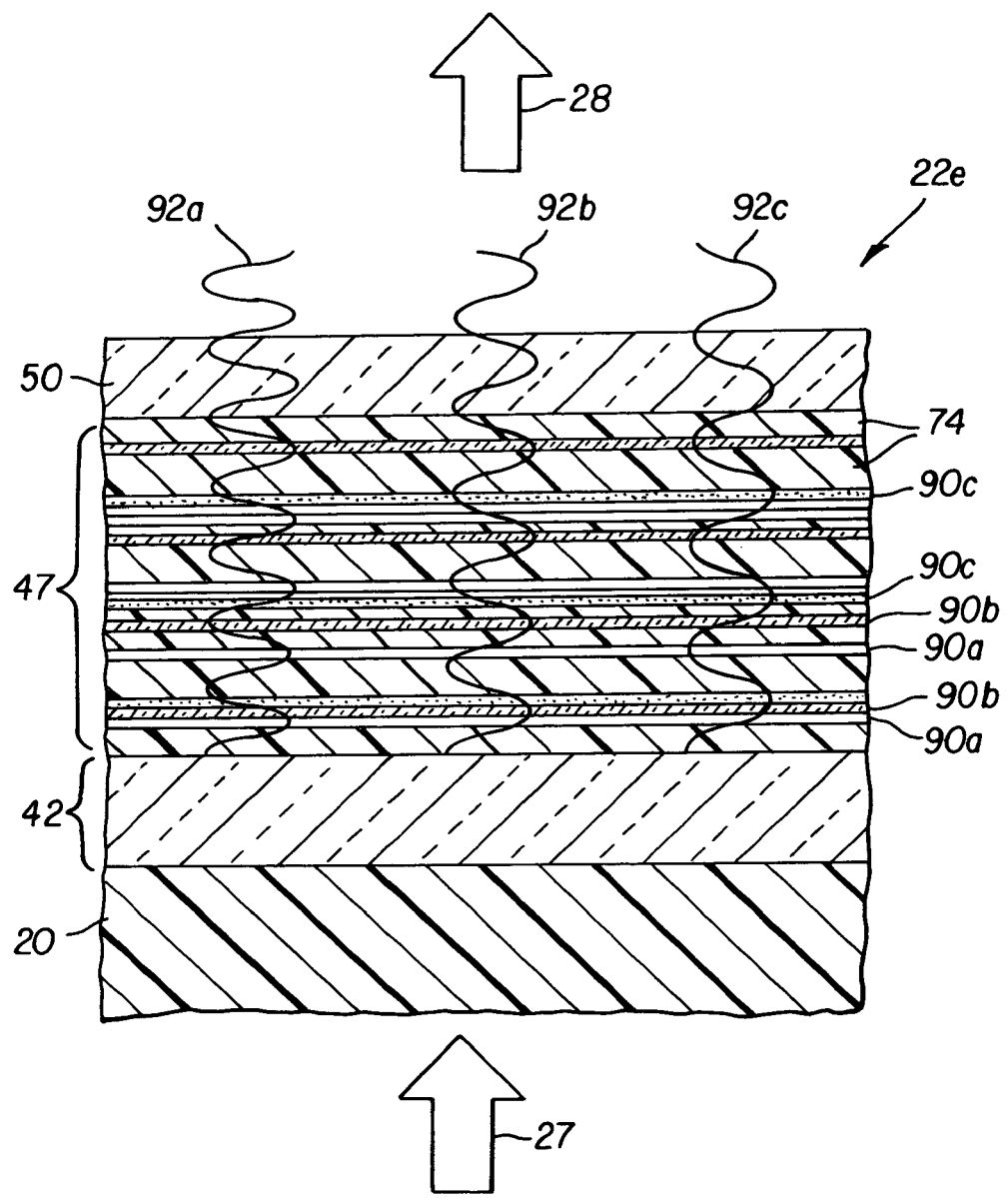
FIG. 6 is a cross-section of a fifth organic laser film structure that features periodic resonant gain layers for multiple wavelength ranges.

FIG. 6 shows a cross-section of a fifth organic laser film structure 22e, which features resonant periodic gain regions. The fifth organic laser film structure 22e is provided atop the substrate 20, and receives pump light 27 in order to produce a laser beam 28. The fifth organic laser film structure 22e comprises a bottom mirror 42, an active region 47, and a top pump mirror 50. The fifth organic laser film structure 22e further comprises three different molecular compositions (organic host-dopant combinations) in different periodic gain regions. First periodic gain regions 90a are provided comprising material with a first molecular composition that provides optical gain within a first laser wavelength range. A first standing-wave intensity pattern 92a is shown schematically, and corresponds to the standing-wave of a laser wavelength within the first laser wavelength range. The first periodic gain regions 90a are situated to substantially overlap the peaks of the first standing-wave intensity pattern 92a.

The active region 47 of the fifth organic laser film structure 22e further comprises second periodic gain regions 90b comprising material with a second molecular composition that provides optical gain within a second laser wavelength range. A second standing-wave intensity pattern 92b is shown schematically, and corresponds to the standing-wave of a laser wavelength within the second laser wavelength range. The second periodic gain regions 90b are situated to substantially overlap the peaks of the second standing-wave intensity pattern 92b.

The active region 47 of the fifth organic laser film structure 22e can further comprise third periodic gain regions 90c comprising material with a third molecular composition that provides optical gain within a third laser wavelength range. A third standing-wave intensity pattern 92c is shown schematically, and corresponds to the standing-wave of a laser wavelength within the third laser wavelength range. The third periodic gain regions 90c are situated to substantially overlap the peaks of the third standing-wave intensity pattern 92c.

The regions between the layers comprising the first, second, and third periodic gain regions 90a, 90b, and 90c, are filled with organic spacer layers 74. The spacer layers 74 have thicknesses controlled to locate the first, second, and third periodic gain regions 90a, 90b, and 90c in the appropriate locations at the peaks of the first, second, and third standing-wave intensity patterns 92a, 92b, and 92c.

According to FIG. 6, the first laser wavelength range could be in the blue portion of the optical spectrum, the second laser wavelength range could be in the green portion of the optical spectrum, and the third laser wavelength range could be in the red portion of the optical spectrum. Such a configuration would be useful, for example in a full-color display or printing system. However, it should be obvious that the use of two colors or more than three colors could be realized with the same concepts.

The bottom mirror 42 in the fifth organic laser film structure 22e must be highly reflective for the wavelengths spanning the first, second, and third laser wavelength ranges while being transmissive to the pump light 27. Conversely, the top pump mirror 50 must be highly transmissive for the wavelengths spanning the first, second, and third laser wavelength ranges while being reflective to the pump light 27. Alternatively, the top pump mirror 50 could be replaced with an internal mirror with a partial reflectance for the wavelengths spanning the first, second, and third laser wavelength ranges in order to create a coupled-cavity variant of this laser.

Figure 7:
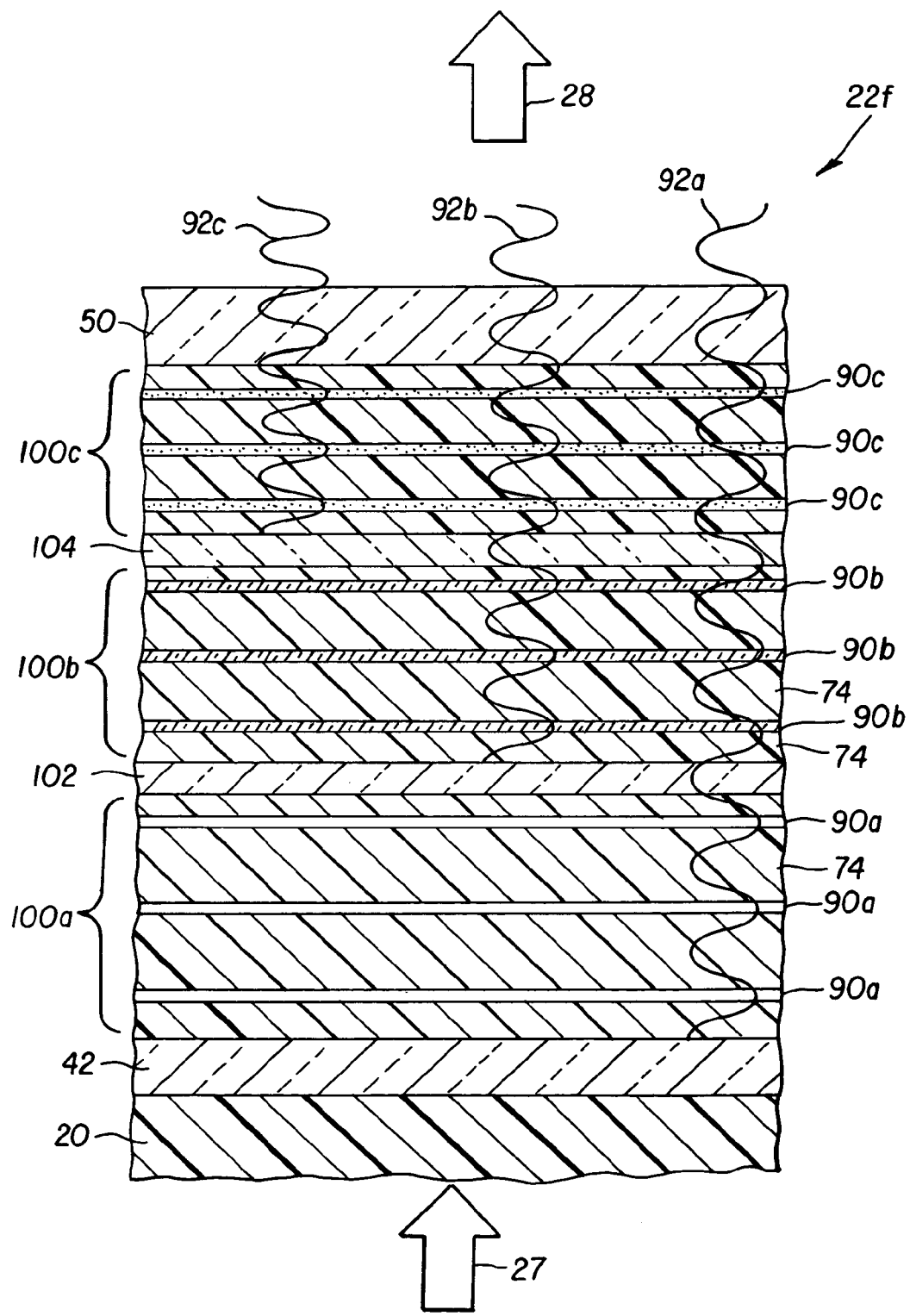
FIG. 7 is a cross-section of a sixth organic laser film structure that features multiple active regions with periodic resonant gain layers for multiple wavelength ranges.

FIG. 7 shows a cross-section of a sixth organic laser film structure 22f, which features three different active regions with different molecular compositions of organic gain materials. The sixth organic laser film structure 22f is provided atop the substrate 20, and receives pump light 27 in order to produce a laser beam 28. The sixth organic laser film structure 22f comprises a bottom mirror 42 and a top pump mirror 50. The sixth organic laser film structure 22f differs from the fifth organic laser film structure 22e in that three different active regions are provided to produce optical gain for three different laser wavelength ranges. A first active region 100a is provided atop a bottom mirror 42. The bottom mirror 42 in the sixth organic laser film structure 22f is highly reflective over a first laser wavelength range and substantially transmissive to the pump light 27. The first active region 100a comprises first periodic gain regions 90a comprising material with a first molecular composition that provides optical gain within the first laser wavelength range. The first periodic gain regions 90a are separated by spacer layers 74 in order to locate the first periodic gain regions 90a near the peaks of a first standing-wave intensity pattern 92a. The first standing-wave intensity pattern 92a, shown diagrammatically in FIG. 7, is the standing-wave pattern arising from a laser wavelength within the first laser wavelength range.

Atop the first active region 100a, a first mirror 102 is provided. The first mirror 102 is composed of layers of the same materials, and deposited with the same techniques, as the top pump mirror 50 in the first organic laser film structure 22a. The first mirror 102 is highly transmissive for wavelengths in the first laser wavelength range but is highly reflective for wavelengths in the second laser wavelength range. Alternatively, the first mirror 102 could have a partial reflectance for wavelengths in the first laser wavelength range to enable a coupled-cavity variant of this laser. The first mirror 102 is also desired to be substantially transmissive to the pump light 27.

Atop the first mirror 102, a second active region 100b is provided.

The second active region 100b comprises second periodic gain regions 90b comprising material with a second molecular composition that provides optical gain within the second laser wavelength range. The second periodic gain regions 90b are separated by spacer layers 74 in order to locate the second periodic gain regions 90b near the peaks of a second standing-wave intensity pattern 92b. The second standing-wave intensity pattern 92b, shown diagrammatically in FIG. 7, is the standing-wave pattern arising from a laser wavelength within the second laser wavelength range. Because the first mirror 102 is highly reflecting within the second laser wavelength range, laser wavelengths within the second laser wavelength range do not penetrate significantly into the first active region 100a. Hence, the laser resonator for laser wavelengths within the second laser wavelength range for the thin-film organic laser 10 with the sixth organic laser film structure 22f is between the first mirror 102 and the external mirror 24.

Atop the second active region 100b, a second mirror 104 is provided. The second mirror 104 is composed of layers of the same materials, and deposited with the same techniques, as the top pump mirror 50 in the first organic laser film structure 22a and the first mirror 102. The second mirror 104 is highly transmissive for wavelengths in the first and second laser wavelength ranges but is highly reflective for wavelengths in the third laser wavelength range. Alternatively, the second mirror 104 could have a partial reflectance for wavelengths in the second and/or first laser wavelength ranges to enable a coupled-cavity variant of this laser. The second mirror 104 is also desired to be substantially transmissive to the pump light 27.

Atop the second mirror 104, a third active region 100c is provided. The third active region 100c comprises third periodic gain regions 90c comprising material with a third molecular composition that provides optical gain within the third laser wavelength range. The third periodic gain regions 90c are separated by spacer layers 74 in order to locate the third periodic gain regions 90c near the peaks of a third standing-wave intensity pattern 92c. The third standing-wave intensity pattern 92c, shown diagrammatically in FIG. 7, is the standing-wave pattern arising from a laser wavelength within the third laser wavelength range. Because the second mirror 104 is highly reflecting within the third laser wavelength range, laser wavelengths within the third laser wavelength range do not penetrate significantly into the first or second active regions 100a and 100b. Hence, the laser resonator for laser wavelengths within the third laser wavelength range for the thin-film organic laser 10 with the sixth organic laser film structure 22f is between the second mirror 104 and the external mirror 24.

A top pump mirror 50 is provided atop the third active region 100c. The top pump mirror 50 is composed of layers of the same materials, and deposited with the same techniques, as the top pump mirror 50 in the first organic laser film structure 22a. The top pump mirror 50 is highly transmissive over the first, second, and third laser wavelength ranges and substantially reflective for the pump light 27. Alternatively, the top pump mirror 50 could be partially reflective over the first, second, and/or third laser wavelength ranges to enable a coupled-cavity variant of this laser.

In FIG. 7, the first laser wavelength range could comprise the red portion of the visible spectrum, the second laser wavelength range could comprise the green portion of the visible spectrum, and the third laser wavelength range could comprise the blue portion of the visible spectrum. Such a configuration could be useful, for example, if the host material for each organic host-dopant combination is absorptive over a spectral range slightly blue-shifted from the laser wavelength range provided by the particular host-dopant combination. For example, the host in a host-dopant combination that emits in the red laser wavelength region could be absorptive in the green. In this case, confining this host to the first active region 100a and having the second laser wavelength region comprise the green portion of the optical spectrum ensures that the green light is not absorbed by the host.

Continuing the example, the host in a host-dopant combination that emits in the green laser wavelength region could be absorptive in the blue. In this case, confining this host to the second active region 100b and having the third laser wavelength region comprise the blue portion of the optical spectrum ensures that the blue light is not absorbed by the host. Hence, the cavity losses due to absorption of the laser light are minimized.

Six embodiments for the organic laser film structure have been described in detail. Many combinations of the six organic laser film structures 22a through 22f are possible, and are considered within the scope of the invention. For example, an organic laser film structure with a resonant periodic gain, as in 22c, could be provided with an internal mirror, as in 22b, to form a coupled-cavity laser with resonant periodic gain. Similarly, combinations of the embodiments using multiple types of organic gain materials could be considered within the scope of the invention.

Figure 8:
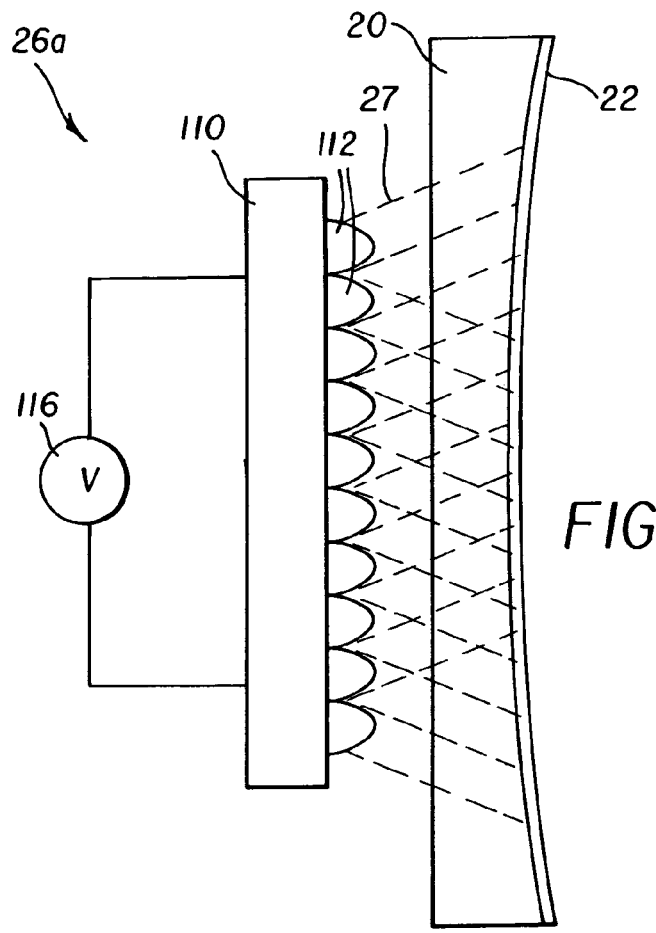
FIG. 8 is a schematic of a first optical pumping means using proximate LEDs.

Specific embodiments of the optical pumping means 26 are now described in detail. FIG. 8 shows a first optical pumping means 26a. The first optical pumping means 26a comprises an LED array 110. The LED array 110 comprises a plurality of light-emitting diodes (LEDs) 112 that emit in the blue-violet spectral range. LED drive electronics 116 are provided in order to energize the LEDs 112. When energized, the LEDs 112 emit pump light 27 at a wavelength useful for pumping the organic laser film structure 22. The LED array 110 is placed immediately behind the substrate 20 in order to minimize spreading of the pump light 27. The individual LEDs 112 produce light with a characteristic intensity and angular distribution. The pump density at the organic laser film structure 22 is determined by the density with which the LEDs 112 are packed (which determines an average intensity for the LED array 110), as well as the spreading of the light due to the short propagation from the LED array 110 to the organic laser film structure 22 through the substrate 20.

A pertinent example of an LED 112 that is useful for pumping Alq is an ultraviolet LED, e.g. from Cree (specifically, the XBRIGHT® 900 UltraViolet Power Chip® LEDs). These sources emit light centered near 405 nm wavelength and are known to produce power densities on the order of 20 W/cm$^2$ in chip form. The use of a laser resonator with high finesse and low internal loss allows a lasing transition at a very low threshold (below 0.1 W/cm$^2$ power density). Thus, even taking into account limitations in utilization efficiency due to device packaging and the extended angular emission profile of the LEDs, the LED brightness is sufficient to pump the laser cavity at a level many times above the lasing threshold. This low threshold enables incoherent optical sources to be used for the pumping instead of the focused output of laser diodes, which is conventionally used in other laser systems.

In order to match the pump area to the desired Gaussian mode area at the organic laser film structure 22, the LED array 110 should have a size and shape matching the desired Gaussian mode area. For a thin-film organic laser 10 in which aperture 30 is provided for mode-control, as shown in FIG. 1, it is sufficient to package LEDs 112 into a circular LED array 110 with radius approximately equal to $w_1$. The LED drive electronics 116 can consist of a simple DC voltage source connected to all the LEDs 112 in parallel, so that all LEDs 112 emit approximately the same optical power.

However, as discussed previously, the excitation distribution, which is proportional to the intensity profile of the pump light 27, is preferred to overlap closely with the Gaussian mode shape in one embodiment of the present invention in order to provide lateral mode control. In order to accomplish this with the first optical pumping means 26a, the individual LEDs 112 in the LED array 110 must be driven to different levels relative to each other in order to produce the desired intensity profile. As an example, for a TEM$_{00}$ lateral mode, the intensity emitted by the LEDs 112 will be driven at a maximum intensity at the center of the LED array 110. Other LEDs 112 will be driven at intensities proportionally lower than the maximum intensity based on their distances from the center of the LED array 110 in an approximately Gaussian manner.

In order to accomplish the excitation distribution shaping, the LED drive electronics 116 must provide different drive voltages to the various LEDs 112. One method of accomplishing this is to provide multiple voltage sources with each voltage source driving one or more LEDs 112 within the LED array 110 at the same level. Another method of accomplishing this is to use a single voltage source in combination with an array of voltage-divider circuits, with each voltage-divider circuit comprising a variable resistor, or a resistor preselected to provide the desired voltage ratio to produce a desired pump intensity profile.

One advantage of the first optical pumping means 26a is that the excitation distribution can be easily controlled by the means previously discussed. The example provided above was the use of the pump intensity profile to produce a TEM$_{00}$ Gaussian mode. However, the excitation distribution can be shaped to produce higher-order transverse modes or a combination of multiple transverse modes.

One important example is the generation of a single-mode by multimode laser beam that has a single Gaussian lateral mode in a single-mode direction and is characterized by a plurality of lateral modes in a multimode direction, which is orthogonal to the single-mode direction. The single-mode by multimode laser beam would be useful for coupling to one-dimensional spatial light modulators for a display or printing system. In order to achieve this, the excitation distribution could be shaped by controlling the drive voltages of the individual LEDs 112 into an approximately Gaussian shape in the single-mode direction and the intensity profile of the desired combination of lateral laser modes in the multimode direction. If an aperture 30 is included in the resonator, the aperture 30 would be elongated such that only the lowest-order Gaussian mode would pass in the single-mode direction, but the desired number of lateral modes would be allowed to pass in the multimode direction. The shape of the hole in the aperture 30 would be an elongated rectangle or ellipse, or a slit.

An alternative to individually modulating the pump LEDs 112 to achieve a desired excitation distribution is to drive all LEDs to produce a uniform output and provide an apodizing filter (not shown) between the LED array 110 and the substrate 20. The apodizing filter would have a spatially varying attenuation for the pump light, such that the attenuation produces the desired pump intensity profile. An example might be a metallic neutral density filter with a radially varying metal thickness that produces an attenuation with a circular Gaussian profile.

Figure 9:
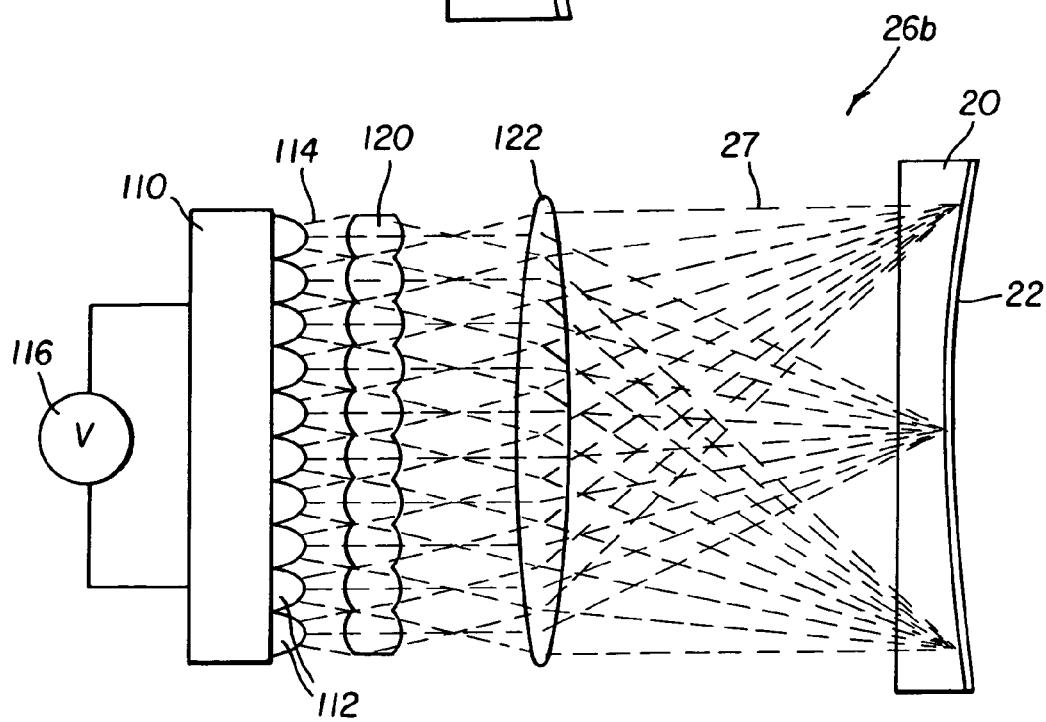
FIG. 9 is a schematic of a second optical pumping means using LEDs and lenslet array coupling.

FIG. 9 shows a second optical pumping means 26b. The second optical pumping means 26b comprises an LED array 110, which comprises a plurality of LEDs 112. The LEDs 112 are energized by LED drive electronics 116 to emit pump beams 114. A lenslet array 120 is disposed after the LED array 110, with one lenslet collecting the light emitted by a single LED 112. A lens 122 is disposed after the lenslet array 120 and directs the pump light 27 into the back side of the substrate 20 to form overlapped images of the LEDs 112 on the organic laser film structure 22.

Alternatively, a similar arrangement could be used whereby the lens 122 images the intensity distribution at the entrance faces of each of the lenslets in the lenslet array 120 onto the organic laser film structure 22. In this case, the lenslets need not be matched one-for-one with the LEDs, and a uniform excitation distribution would result over an area with a shape given by the shape of the lenslets. For the single-mode by multimode case, the lenslets could be cylindrical such that a uniform profile would result in the axis of power for the lenslets, which is aligned to the multimode direction, and the natural LED intensity distribution would result in an approximately Gaussian pump intensity distribution in the single-mode direction. Alternatively, a desired excitation distribution can be obtained by uniformizing and illuminating an apodizing filter (not shown) provided between the lens 122 and the substrate 20, preferably near the substrate 20.

The lens 122 can be selected to image the LEDs to the organic laser film structure 22 with a given magnification. Thus, given an LED active area and the desired laser mode area, the lens 122 can be selected to ensure the correct mode area regardless of the size of the lens array 110. The LED drive electronics 116 can drive each of the LEDs 112 equally, because the variation in output intensity among the LEDs 112 in the LED array 110 does not affect the pump intensity distribution at the organic laser film structure 22. Therefore, the LED drive electronics 116 can comprise a simple DC voltage source for the second optical pumping means 26b.

Figure 10:
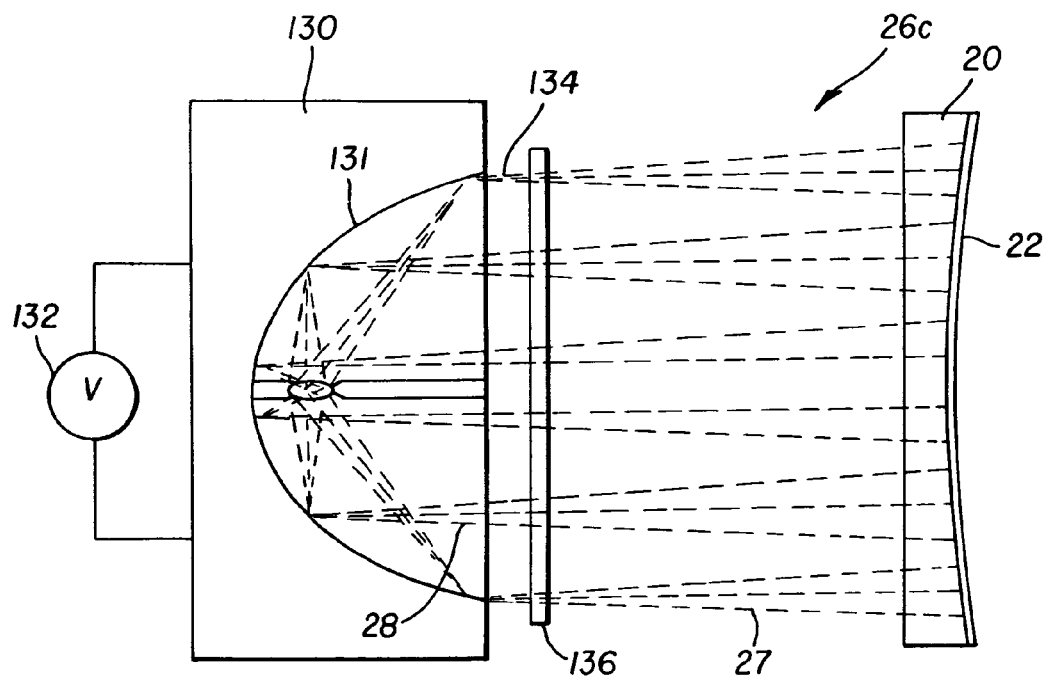
FIG. 10 is a schematic of a third optical pumping means using an arc lamp.

FIG. 10 shows a third optical pumping means 26c, which uses a lamp. The third optical pumping means 26c comprises a lamp 130 that, when driven by a power supply 132, produces a light beam 134 with at least one wavelength useful for optical pumping. A spectral filter 136 is provided to remove any undesired spectral components of the light beam 134. The spectral filter 136 is reflective or absorptive over wavelengths produced by the lamp 130 that are not useful for optical pumping, while transmitting pump light 27 containing wavelengths that are desired for pumping. The pump light 27 illuminates the substrate 20 and is absorbed in the organic laser film structure 22. In order to provide a desired excitation distribution, an apodizing filter (not shown) can be provided between the lamp 130 and the substrate 20.

An example of a useful lamp 130 for pumping Alq is a mercury high-intensity discharge lamp, which is available from many vendors, such as Osram and Perkin-Elmer. The mercury lamp produces spectral lines at 404.7 nm and 435.8 nm that can be useful for optical pumping of organic laser materials. The spectral filter 136 would be required to remove spectral lines at 184.9 m, 253.7 nm, 312.9 nm, 365.4 nm, 546.1 nm, and 578.0 nm. The spectral filter 136 could comprise, but is not limited to, a UV absorbing glass substrate such as are available from Schott or Corning, which is absorbing for the 184.9 nm through 365.4 nm wavelengths, with a dichroic low-pass filter that is transmissive at the desired 404.7 nm and 435.8 nm wavelengths and is reflective at the undesired 546.1 nm and 578.0 nm wavelengths.

FIG. 10 shows the simplest embodiment wherein a parabolic reflector 131 is used that produces a light beam 134 that is substantially collimated with a radius that matches the desired mode of the laser beam 28. In practice, to achieve the desired mode radius, a smaller light beam 134 could be used and allowed to spread by propagating a required distance. This could also assist in removing any dark spots in the center of the beam due to obscurations in the lamp 130. Alternatively, a diffuser could be disposed between the lamp 130 and the substrate 20 in order to spread the light beam 134 and remove any dark spots. The diffuser could also be provided in the form of a diffusing surface treatment to the substrate 20 surface opposite the organic laser film structure 22. Finally, a lens could also be provided in order to produce the required pump size.

Alternatively, a lamp 130 with an elliptical reflector (not shown) could be used, which produces a converging light beam 134. The light beam could be allowed to converge to an image of the filament or arc on the organic layer film structure 22. Alternatively, a lens and/or diffuser (not shown) could be provided to provide a suitably softened image of the filament or arc at the required magnification to match the desired radius $w_1$ of the laser beam 28. As yet another alternative, a lens (not shown) could be provided to collimate the light beam 134 to produce collimated pump light 27 with the desired radius $w_1$.

Figure 11:
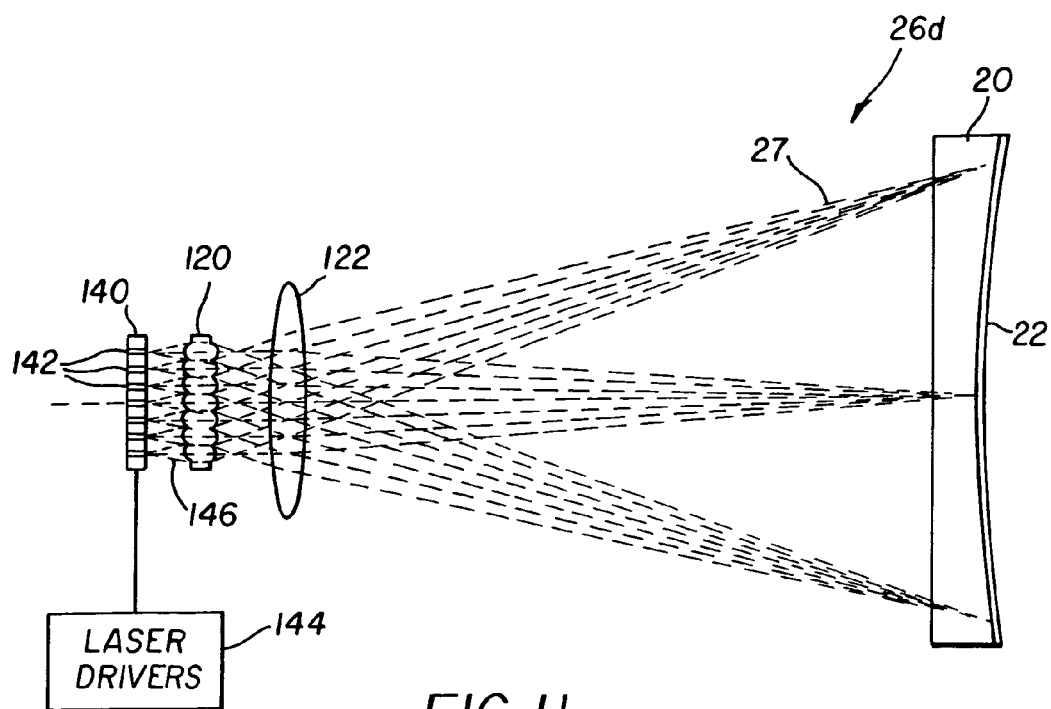
FIG. 11 is a schematic of a fourth optical pumping means using a laser.

FIG. 11 shows a fourth optical pumping means 26d, which uses a laser array. Laser pumping is generally less desirable than the LED or lamp pumping due to the cost associated with the pump laser sources. However, laser pumping would be required if the thin-film organic laser 10, shown in FIG. 1, possesses losses that result in a pump threshold density that challenges the inherent brightness limits of the incoherent LED or lamp pump sources.

The fourth optical pumping means 26d comprises a pump laser array 140, which comprises a plurality of pump lasers 142. Laser drivers 144 are provided to excite each pump laser 142 to emit pump laser light 146 at a wavelength appropriate for pumping the organic laser film structure 22. The pump laser light 146 is collected by a lenslet array 120 and the contributions from the individual pump lasers 142 are combined with lens 122. The resulting pump light 27 is the overlapped contribution from the individual pump lasers 142 that creates a desired excitation profile on the organic laser film structure 22.

The pump laser array is preferably a multi-emitter bar comprising wide-stripe edge-emitting GaN laser diodes that produce laser light of approximately 405 nm wavelength. Alternatively, separately packaged GaN laser diodes could be used, for example coupled into optical fibers. In this case, pump laser array 140 could comprise a V-groove array holding the output facets of the optical fibers in a linear array.

Alternatively, a single laser source could be used for pumping. In this embodiment, lenslet array 120 would not be required, and lens 122 would simply size the pump laser beam to the dimensions required for the desired excitation distribution. However, currently available GaN laser diodes do not provide the power necessary to generate moderate power levels from a thin-film organic laser 10. A nitrogen laser could be used for the pump laser array 140, but this is undesirable due to the high-cost and low efficiency of such a laser.

The invention has been described with reference to a preferred embodiment; However, it will be appreciated that variations and modifications can be effected by a person of ordinary skill in the art without departing from the scope of the invention.

PARTS LIST

10 Thin-film organic laser
20 Substrate
22 Organic laser film structure
22a First organic laser film structure
22b Second organic laser film structure
22c Third organic laser film structure
22d Fourth organic laser film structure
22e Fifth organic laser film structure 22f Sixth organic laser film structure
24 External mirror
26 Optical pumping means
26a First optical pumping means
26b Second optical pumping means
26c Third optical pumping means
26d Fourth optical pumping means
27 Pump light
28 Laser beam
30 Aperture
32 Emitted laser beam
34 Wavelength tuning element
36 Curve
38 Curve
40 Curve
42 Bottom mirror
44 High-index layer
46 Low-index layer
47 Active region
48 Organic gain layer
50 Top pump mirror
60 Internal mirror
62 Standing-wave intensity pattern
72 Periodic gain regions
74 Organic spacer layers
80a First organic gain layer
80b Second organic gain layer
80c Third organic gain layer
90a First periodic gain regions
90b Second periodic gain regions
90c Third periodic gain regions
92a First standing-wave intensity pattern
92b Second standing-wave intensity pattern
92c Third standing-wave intensity pattern
100a First active region
100b Second active region
100c Third active region
102 First mirror
104 Second mirror
110 LED array
112 Light-Emitting Diodes
114 Pump beams
116 LED drive electronics
120 Lenslet array
122 Lens
130 Lamp
131 Parabolic reflector
132 Power supply
134 Light beam
136 Spectral filter
140 Pump laser array
142 Pump lasers
144 Laser drivers
146 Pump laser light

What is claimed is:

1. A thin-film organic laser, comprising:
   a) a substrate;
   b) a bottom mirror provided on the substrate;
   c) at least one active region deposited on the bottom mirror, wherein the at least one active region includes organic gain material, wherein an organic active region is provided that includes one or more periodic gain regions aligned with antinodes of a light source's standing wave electromagnetic field, and organic spacer layers disposed on either side of the periodic gain regions;
   d) an external mirror provided at a predetermined distance from the at least one active region such that the bottom mirror combined with the external mirror forms a laser resonator; and
   e) an optical pumping means for exciting the organic gain material to produce a laser beam with a wavelength $\lambda$ and at least one lateral laser mode in the laser resonator and an output of laser light.

2. The thin-film organic laser claimed in claim 1, wherein the predetermined distance of the external mirror from the active region is greater than a thickness, $t_{act}$, of the active region.

3. The thin-film organic laser claimed in claim 1, wherein the predetermined distance of the external mirror from the active region is greater than 10 mm.

4. The thin-film organic laser claimed in claim 1, further comprising:
   f) a birefringent tuning element provided between the active region and the external mirror.

5. The thin-film organic laser claimed in claim 4, wherein the birefringent tuning element tunes the wavelength $\lambda$.

6. The thin-film organic laser claimed in claim 1, further comprising:
   f) a Fabry-Perot etalon provided between the active region and the external mirror.

7. The thin-film organic laser claimed in claim 6, wherein the Fabry-Perot etalon tunes the wavelength $\lambda$.

8. The thin-film organic laser claimed in claim 1, further comprising:
   f) an aperture, having a predetermined diameter, for controlling the at least one lateral laser mode.

9. The thin-film organic laser claimed in claim 8, wherein the aperture is a circle.

10. The thin-film organic laser claimed in claim 8, wherein the aperture has a diameter in relation to the at least one lateral laser mode.

11. The thin-film organic laser claimed in claim 8, wherein the aperture is elongated such that a plurality of later laser modes are transmitted in one direction and a single lateral laser mode is transmitted in another direction.

12. The thin-film organic laser claimed in claim 1, wherein the optical pumping means provides the excitation of the organic gain material respective to the at least one lateral laser mode such that an excitation distribution overlaps an intensity profile of the at least one lateral laser mode.

13. The thin-film organic laser claimed in claim 1, wherein the at least one active region includes a plurality of different molecular compositions of organic gain material such that each of the different molecular compositions of organic gain material has a corresponding laser wavelength range.

14. The thin-film organic laser claimed in claim 13, wherein the plurality of different molecular compositions of organic gain material are small molecular weight organic host-dopant combinations.

15. The thin-film organic laser claimed in claim 14, wherein the plurality of different molecular compositions of organic gain material are selected from the group consisting of: aluminum tris(8-hydroxyquinoline) (Alq), [4-(dicyanomethylene)-2-t-butyl-6-(1,1,7,7-tetramethyljulolidyl-9-enyl)-4H-pyran] (DCJTB), and [10-(2-benzothiazolyl)-2,3,6,7-tetrahydro-1,1,7,7-tetramethyl-1H,5H,11H-[1]Benzopyrano[6,7,8-ij]quinolizin-11-one] (C545T).

16. The thin-film organic laser claimed in claim 13, wherein the plurality of different molecular compositions of organic gain material are individually aligned corresponding to a plurality of standing wave peaks within the at least one active region.

17. The thin-film organic laser claimed in claim 1, wherein the optical pumping means a source of photons which are selected from the group consisting of: light emitting diodes (LEDs), lamps, and lasers.

18. The thin-film organic laser claimed in claim 1, wherein the optical pumping means includes an array of individual-addressable light emitting diodes.

19. The thin-film organic laser claimed in claim 18, wherein the individually-addressable light emitting diodes are modulated to produce a pumping intensity distribution that overlaps an intensity profile of the at least one lateral laser mode.

20. The thin-film organic laser claimed in claim 17, the optical pumping means further comprising a lenslet array in cooperation with the source of photons.

21. The thin-film organic laser claimed in claim 19, the optical pumping means further comprising an apodizing filter having a spatial-varying attenuation and provided between the source of photons and the substrate to produce a pumping intensity distribution that overlaps an intensity profile of the at least one lateral laser mode.

22. The thin-film organic laser claimed in claim 1, wherein the substrate has a spherical surface with a radius of curvature, $R_1$.

23. The thin-film organic laser claimed in claim 22, wherein the predetermined distance from the active region is $R_1-\Delta$, wherein $\Delta$ is between 0 and $0.01R_1$.

* * * * *

UNITED STATES PATENT AND TRADEMARK OFFICE
CERTIFICATE OF CORRECTION

| | | |
|---|---|---|
| PATENT NO. | : 7,065,115 B2 | Page 1 of 1 |
| APPLICATION NO. | : 10/767713 | |
| DATED | : June 20, 2006 | |
| INVENTOR(S) | : Brian E. Kruschwitz et al. | |

It is certified that error appears in the above-identified patent and that said Letters Patent is hereby corrected as shown below:

Column 22, Line 4 Please change "claim 19" to --claim 17--

Signed and Sealed this

Twenty-seventh Day of March, 2007

JON W. DUDAS
*Director of the United States Patent and Trademark Office*